United States Patent [19]

De Vries

[11] 4,236,046

[45] Nov. 25, 1980

[54] HIGH CAPACITANCE BUS BAR

[75] Inventor: Donald H. De Vries, Mesa, Ariz.

[73] Assignee: Rogers Corporation, Rogers, Conn.

[21] Appl. No.: 950,265

[22] Filed: Oct. 10, 1978

[51] Int. Cl.³ .............................................. H01B 5/00
[52] U.S. Cl. .................................. 174/72 B; 361/306
[58] Field of Search ...................... 174/72 B; 361/306

[56] References Cited

U.S. PATENT DOCUMENTS 3,396,230 8/1968 Crimmins ........................... 174/72 B
3,778,735 12/1973 Steenmetser ................ 174/72 B UX Primary Examiner—Roy N. Envall, Jr.
Attorney, Agent, or Firm—Fishman & Van Kirk

[57] ABSTRACT

A high capacitance bus bar including at least two separated conductive plates between which a plurality of capacitive ceramic dielectric chips are positioned and adhered. Opposite faces of the chips are coated with a thin, integral and continuous film of conductive material and the coated chips are adhered to the conductive plates with a conductive adhesive.

6 Claims, 4 Drawing Figures

HIGH CAPACITANCE BUS BAR

BACKGROUND OF THE INVENTION (1) Field of the Invention

The present invention relates to bus bars having relatively high capacitance. More particularly the present invention relates to miniaturized-bus bars.

(2) Description of the Prior Art

A conventional miniaturized-bus bar comprises at least two conductive plates or elements having a thickness of about 10 mils and made from copper. Generally speaking, a conventional miniaturized-bus bar is about 0.2 inches wide and has a length of five to eight inches. The conductive plates of the bus bar are separated by a plastic dielectric film such as MYLAR. The MYLAR is adhered to the conductive plates by an adhesive. This prior art bus bar has a relatively low capacitance.

It is one object of the present invention to provide a high capacitance bus bar. Other objects of the invention will be apparent from the following description of the invention.

SUMMARY OF THE INVENTION

The bus bar of the present invention comprises at least two conductive plates or elements, the conductive plates being spaced apart so as to accomodate a dielectric material. The dielectric material comprises the plurality to thin ceramic chips, the opposite surfaces of the chips being coated with a thin, integral and continuous film of conductive material. A plurality of dielectric chips are placed between the conductive plates and adhered to the conductive plates by two layers of conductive adhesive. In order to obtain a high capacitance bus bar and to prevent electrical shorting between two conductive plates, the layers of conductive adhesive must be prevented from contacting each other.

The dielectric chips may be adhered to the conductive plates by use of various adhesive systems. In one embodiment of the invention, the adhesive system comprises a fabric material which is impregnated with a conductive adhesive. In the preferred embodiment of the invention, the conductive adhesive includes microparticles distributed therein. In both embodiments, the fabric and the microparticles function to insure separation of the outer conductive plates of the bus bar.

The bus bar has an important property: even if the ceramic chips are fractured during fabrication or handling of the bus bar, the capacitance of the bus bar is maintained.

DETAILED DESCRIPTION OF THE INVENTION

Figure 1:
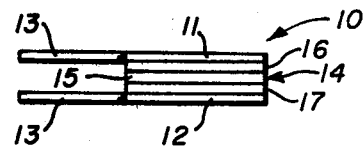
FIG. 1 shows a side view of a bus bar in accordance with the present invention.

Referring to FIGS. 1, 2, 3 and 4 simultaneously, a bus bar indicated generally at 10 in FIG. 1 includes a first conductive plate or element 11 and a second conductive plate or element 12. Each of conductors 11 and 12 includes a plurality of distribution prongs or tabs 13. The conductors 11 and 12 are preferably formed from copper foil and have a thickness of approximately 10 mil.

Conductors 11 and 12 are separated by a dielectric layer 14 which comprises a plurality of ceramic dielectric chips 15 each having a relatively high dielectric constant. Generally speaking, the ceramic dielectric chips 15 have a thickness in the range from about 0.005 inches to about 0.015 inches and have a surface dimension in the range from about 0.2 inches by 0.2 inches to about 0.2 inches by 3 inches. The ceramic material should have a relatively high dielectric constant, that is, a dielectric constant in excess of about 8000. Ceramic materials that are commonly used for capacitors may be used in the bus bar of the present invention. An exemplary ceramic material for use in the bus bar of the present invention is barium titinate and modifications of barium titinate. The chips are coated with a thin, intimate, and continuous conductive coating on each of the opposite sides of the chip. The coating may either be a metal coating or a conductive polymer coating. In effect, each chip is a small capacitor.

Dielectric chips 15 are positioned between conductors 11 and 12 and are adhered to conductors 11 and 12 respectively by adhesive layers 16 and 17. Adhesive layers 16 and 17 are conductive so as to provide for electrical conduction between conductors 11 and 12 and the conductive coatings on the surfaces of chips 15. In order to prevent short circuiting between conductors 11 and 12, it is necessary that conductive adhesive layers 16 and 17 be out of contact with each other.

Figure 3:
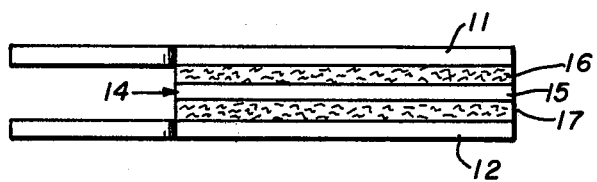
FIG. 3 shows an enlarged side view of a bus bar of the type depicted in FIG. 1, FIG. 3 showing a bus bar wherein the adhesive system is a fabric impregnated with conductive adhesive.

Referring to FIG. 3, one embodiment of adhesive layers 16 and 17 is shown. In this embodiment the layers 16 and 17 comprise a sheet of fabric impregnated with a conductive adhesive. The fabric is preferably made from a woven material and includes voids which provide for the impregnation of conductive adhesive. An example of a fabric which may be used in the embodiment shown in FIG. 3 is fiberglass.

Figure 4:
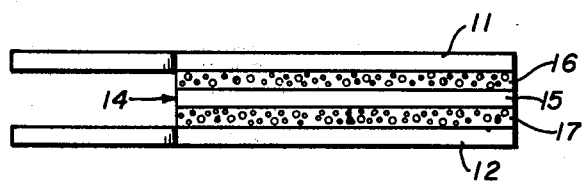
FIG. 4 shows an enlarged view of a bus bar of the type depicted in FIG. 1, FIG. 4 showing the preferred embodiment of the invention wherein the adhesive system comprises a mixture of conductive adhesive and microparticles.

FIG. 4 shows the preferred embodiment of the bus bar. Adhesive layers 16 and 17 comprise a conductive adhesive mixed with particle material such as microbubbles or microparticles, and, preferably, the particles are uniformly dispersed within the conductive adhesive. An example of a particle material which may be used is glass microspheres.

Adhesives used in connection with either the embodiments shown in FIG. 3 or 4 may be selected from a number of conductive adhesives. The following adhesives are exemplary of adhesives which may be used in connection with the present invention: polyester resins, epoxy, acrylic resins and elastomeric binders. The conductive property of the adhesive may be provided by mixing the adhesive with conductive material, such as, for example, silver flakes, silver coated glass beads, metallic particles or carbon particles. In the presently preferred method of assembly, a conductive resin adhesive is cast in the form of a B stage film and cut into film strips 16 and 17 of desired size for positioning in the assembly. The assembled parts are then heat bonded.

The fabric and the microparticles provide for spacing or separation of conductors 11 and 12. If conductor 11 contacts conductor 12, an undesirable short circuit occurs.

Figure 2:
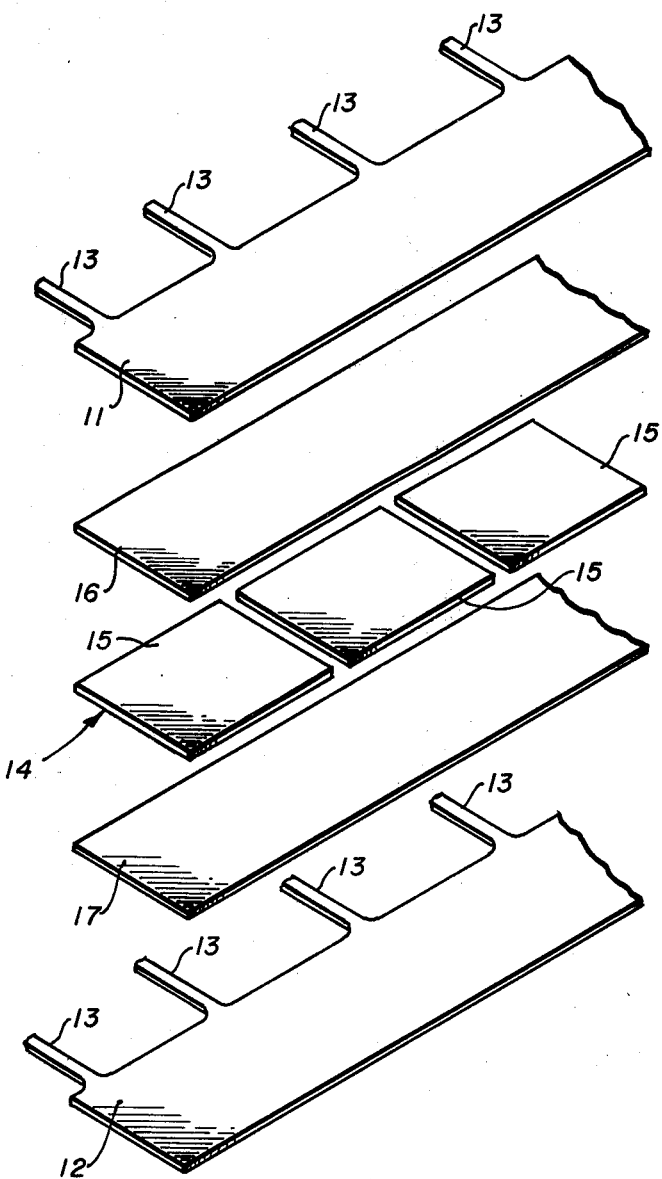
FIG. 2 shows an exploded perspective view of the bus bar shown in FIG. 1.

The ceramic dielectric chips 15 are positioned in planar relation to each other as shown in FIG. 2 and may be adjacent each other or may be spaced apart. If the chips are spaced apart, the spaces or voids between the chips may be left empty or the voids may be filled with a plastic sheet material such as MYLAR. The sheet material is die-cut to provide holes which accomodate the ceramic chips.

Once the various components of the bus bar are assembled, the bus bar is heated to a temperature where the adhesive softens and the bus bar is pressed to provide for firm adherence of the conductors 11 and 12 to the chips 15. During the pressing of the bus bar, the fabric and the microparticles maintain the spacing between the conductors 11 and 12 and reduce or eliminate the possibility of the adhesive flowing and prevent adhesive layers 16 and 17 from contacting each other.

Once the various components of the bus bar are adhered, the entire bus bar, except for prongs 13, may be insulated by any conventional means, such as, for example, insulative coatings or insulative epoxies. The bus bar of the present invention has been described with respect to a bus bar employing a pair of conductors 11 and 12. It should be understood that bus bars according to the present invention may have three or more conductors spaced apart by the dielectric material.

The bus bar formed in accordance with the present invention provides a bus bar having a relatively high capacitance. The bus bar of the present invention has an important property: even if the ceramic chips are fractured during the fabrication or handling of the bus bar, the capacitance of the bus bar is maintained.

The preferred embodiment of the invention is now described by way of example:

The following components of the bus bar are assembled in accordance with the above teaching:

(1) two copper conductors (0.2×8 inches)

(2) a plurality of ceramic chips each having the following dimensions:
width 0.2"
length 1 ½"
thickness 10 mils
and having a metallic conductive coating thereon (3) conductive adhesive strips comprising a polyester resin mixed with carbon particles and silver coated glass microspheres, the strips being in B stage form.

The components are heated to 400° F. for 20 seconds to cure the resin while the conductors are pressed to firmly adhere the components of the bus bar together.

While preferred embodiments have been shown and described, various modifications and substitutions may be made thereto without departing from the spirit and scope of the invention. Accordingly, it will be understood that the present invention has been described by way of illustration and not limitation.

What is claimed is:

1. A high capacitance bus bar comprising:
   at least a pair of spacially separated elongated conductors;
   a single layer of insulating material disposed between said conductors, said layer of insulating material being comprised of at least a first dielectric element, said dielectric element being comprised of a ceramic material selected for its dielectric constant; and
   conductive adhesive means bonding said conductors to said dielectric element.

2. A bus bar according to claim 1 wherein the conductive adhesive means comprises a fabric impregnated with conductive adhesive.

3. A bus bar according to claim 1 wherein the conductive adhesive comprises a mixture of conductive adhesive means and microparticles.

4. A bus bar according to claim 2 wherein said fabric comprises fiberglass.

5. A bus bar according to claim 3 wherein said microparticles comprise glass microspheres.

6. The bus bar of claim 1 wherein said ceramic material has a dielectric constant of at least 8,000.

* * * * *